United States Patent

Hata et al.

[11] 4,051,274
[45] Sept. 27, 1977

[54] METHOD FOR COATING THE PHOTORESIST ONTO A BELT-LIKE MATERIAL COMPRISING A PERFORATED CARRIER AND METALLIC FOIL

[75] Inventors: Kazuo Hata, Kameoka; Sumio Mitani, Hikone, both of Japan

[73] Assignee: Dainippon Screen Seizo Kabushiki-Kaisha, Kyoto, Japan

[21] Appl. No.: 672,329

[22] Filed: Mar. 31, 1976

[30] Foreign Application Priority Data

Apr. 3, 1975  Japan .................................. 50-39797
Apr. 15, 1975  Japan .................................. 50-44757

[51] Int. Cl.² .............................................. B05C 1/08
[52] U.S. Cl. ..................................... 427/172; 29/624; 29/625; 118/249; 156/659; 427/8; 427/96; 427/211; 427/58; 427/278; 427/358; 96/36.2
[58] Field of Search .................... 427/8, 96, 172, 211, 427/58, 278, 358; 118/249; 96/36.2; 156/8, 659; 29/624, 625

[56] References Cited

U.S. PATENT DOCUMENTS

| 3,469,982 | 9/1969 | Celeste ...................................... 96/83 |
| 3,689,991 | 9/1972 | Aird .......................................... 29/577 |
| 3,762,365 | 10/1973 | Herzog ..................................... 118/249 |
| 3,820,994 | 6/1974 | Lindberg et al. ......................... 156/8 |

FOREIGN PATENT DOCUMENTS 46-18874  5/1971  Japan .................................... 427/211

*Primary Examiner*—Ralph S. Kendall
*Assistant Examiner*—John D. Smith
*Attorney, Agent, or Firm*—Schwartz & Weinrieb

[57] ABSTRACT

A method for coating the photoresist by coating rollers onto a belt-like material comprising a perforated film carrier and a metallic foil laminated thereon. This belt-like material, which has so-called device holes or apertures punched off with a predetermined pitch and is particularly to be used for producing lead frames for IC devices, is wound around a back-up roller with its metallic foil facing outward to give a slight tension to the metallic foil. Thus, a uniform and continuous coating of the photoresist onto the foil may be obtained without any dents formed even at those device holes or apertures.

6 Claims, 4 Drawing Figures

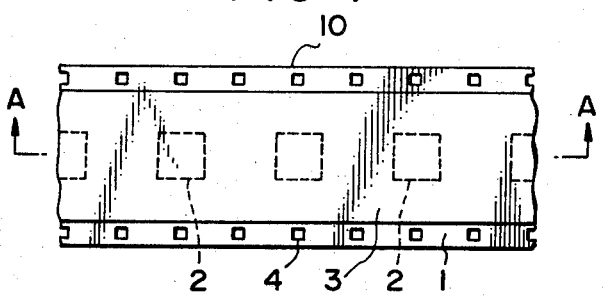
FIG. 1
FIG. 2
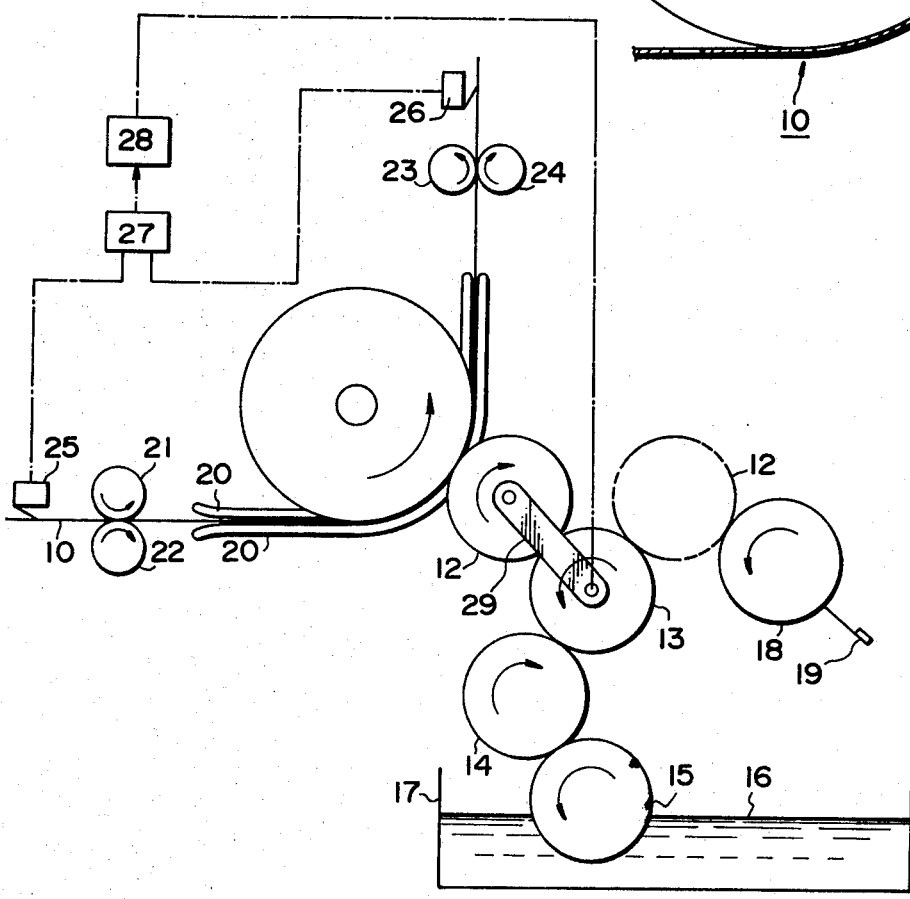
FIG. 3
FIG. 4

METHOD FOR COATING THE PHOTORESIST ONTO A BELT-LIKE MATERIAL COMPRISING A PERFORATED CARRIER AND METALLIC FOIL

The present invention generally relates to a method for continuously and uniformly coating fluid onto the surface of a belt-like material, and more particularly to a method for continuously and uniformly coating the photoresist or the like onto the surface of a thin metal foil which is laminated on a perforated film-like carrier.

As is well known, heretofore there has been use either a spray-coating method or a roller-coating method which this invention primarily relates to, as far as a method for coating fluid on a belt-like material is concerned.

Over the years, particularly since electronical techniques in connection with IC devices have been developed, various novel methods for producing a lead frame, which is extremely useful for positioning IC devices at a required position on a print substrate and connecting both of them or constituting IC devices, have been proposed. Among those methods provided heretofore, such a method may be the most noteworthy that desired original patterns are intermittently exposed onto a film-like photoresist-coated material with a required pitch to form lead frame patterns thereon, and thus formed lead frame patterns undergo etching process to produce lead frames for that use. The above method for producing lead frames naturally requires the photoresist to be uniformly coated on a metal foil surface laminated on a belt-like material. However, as will be explained hereinafter, such a belt-like material has a series of so-called device holes or apertures along its center line with a predetermined pitch besides perforations disposed on both sides thereof. Due to these device holes, it has been very difficult to obtain a uniform coating of the photoresist onto the metallic foil, which tends to be impressed at those device holes by coating rollers.

Accordingly, the present invention is to provide a method for uniformly and continuously coating the photoresist onto a metallic foil surface of a belt-like material, eliminating the above described difficulties encountered in the prior coating apparatus.

The above and other features and objects of the present invention will be more apparent from the following description with reference to the accompanying drawings, in which:

FIG. 1 is a plan view of one embodiment of the belt-like material, to which the method of the invention is applied.

FIG. 2 is a longitudinal cross section view of the same, when taken along the line A—A in FIG. 1.

FIG. 3 is a side view schematically illustrating the essentials of how to embody the method of the invention.

FIG. 4 is a side view schematically illustrating one embodiment of a coating apparatus to embody the method of the invention.

Referring now to FIG. 1, there is shown a belt-like material 10 to be used for producing lead frames thereon through photoetching processes. This belt-like material 10 comprises a plastic carrier 1 of a conventional 35 mm film size and a thin metallic foil 3. The plastic carrier 1 has perforations 4, similar to those of a conventional film, on both sides and so-called device holes or apertures 2 punched off along its center line with a predetermined pitch. The metallic foil 3 of less width than the carrier 1 is laminated on the carrier 1, covering the device holes 2 of the carrier 1.

As referred to before, it is well known to coat fluid on the surface of such belt-like materials by utilizing coating rollers. However, the metallic foil 3 on the carrier 1 is extremely thin, for example somewhat around 0.015 mm thick; due to which the metallic foil 3 is usually too sensitive not to be deformed easily even by a slight external force. If fluid such as the photoresist were coated on such a sensitive metallic foil 3 by the conventional coating rollers, portions of the metallic foil 3 immediately above device holes 2 would be indented and the photoresist to be coated on those portions would be substantially thicker than others.

Referring now to FIG. 3, wherein the most fundamental concept of the invention which can overcome the prior art drawbacks is schematically illustrated, the belt-like material 10 is half wound around a back-up roller 11 with the metallic foil 3 facing outward so as to give a tension to the metallic foil 3 and to prevent dents from being formed at device holes or apertures 2.

Therefore, it will be appreciated that even when the photoresist coating roller 12 is bought to contact the surface of the metallic foil 3 not a slight dent is made on the metallic foil 3 even at those device holes or apertures 2 by the pressure of the coating roller 12 and a uniform coating of the photoresist on the foil surface is thus obtained. It will be also understood that a result thus obtained is exclusively owing to the fact that the belt-like material 10 is wound around the back-up roller 11 so as to give a tension to the metallic foil 3.

In FIG. 4, one embodiment of coating apparatus to carry out the method of the invention is schematically illustrated. The first pair of driving rollers 21 and 22 are horizontally supported distant from the back-up roller 11 on both sides of a substantially horizontal tangent to the roller 11. Also, the second pair of driving rollers 23 and 24 are provided above the back-up roller 11 on both sides of a substantially vertical tangent to the roller 11. Two tangents mentioned above and a portion of the circumference of the back-up roller 11 constitute a travelling path of the beltlike material 10 to be conveyed by the two pairs of driving rollers.

The belt-like material 10 to be coated is held between and fed toward the back-up roller 11 by the first pair of driving rollers 21 and 22, and is then guided by a guiding member 20 disposed along the travelling path so as to go around about a quarter circumference of the back-up roller 11, which serves to bend the material 10 generally orthgonally. It is then conveyed through the second pair of driving rollers 23 and 24 to be processed at the next stage by other apparatus such as a burning-in apparatus.

As will clearly be understood, it is a bent portion of the material 10 where the photoresist is to be coated by the coating roller 12. This roller 12 is operatively associated with the photoresist supply means comprising two intermediate rollers 13 and 14, a supply roller 15 and a tray 16 filled with the photoresist. By these rollers the photoresist in the tray 16 is supplied to the coating roller 12.

The coating roller 12 is provided with suitable driving means (not shown) so as to always rotate in a direction to feed the belt-like material 10. Accordingly, it may be feared that the coating roller 12 gets to directly contact the back-up roller 11 and as a result the photoresist may be coated on the back-up roller 11, too, when a whole length of the beltlike material 10 has passed through between the coating roller 12 and the back-up roller 1.

The coating apparatus to embody the method of the invention is provided with suitable means, which will be explained immediately below, in order to avoid the above problem.

The coating roller 12 is rotatably supported on one end of a swing arm 29 pivotally mounted on a shaft of the intermediate roller 13 so that the roller 12 can shift round to a position shown by a phantom line. Upstream of the first pair of driving rollers 21 and 22 and downstream of the second pair of driving rollers 23 and 24 along the travelling path of the material 10 are two detecting switches 25 and 26, which are adapted to generate output signals when the belt-like material 10 is existing at those switches 25 and 26. These output signals are transmitted to an andgate circuit 27, from which generated are output signals for electrically exciting a solenoid 28 to control the pivotal movement of the lever 29. Accordingly, so long as there are outputs from both of the detecting switches 25 and 26, the coating roller 12 is maintaind in a ready position for coating.

Meanwhile, if one of switches (25 or 26) or either of them does not generate any output — that means that there is not existing the belt-like material 10 at all along its travelling path or either the beginning tip of the material 10 has not yet reached the detecting switch 26 or its tail has already passed another switch 25 —, an electric excitation of the solenoid 28 dies out; which causes the coating roller 12 to retreat to the position of a phantom line.

During the retreat of the coating roller 12, however, the photoresist continues to be supplied to the roller 12, since the roller 12 and its associated rollers 13, 14 and 15 as well are still rotating. On this account, the amount of the supplied photoresist on the outer surface of the roller 12 is gradually increased. This means that, when the roller 12 returns to the coating position to start an coating operation again, the coated amount of the photoresist on the belt-like material 10 will become excessive.

In order to prevent this problem, a squeezee roller 18 engageable with the coating roller 12 during its retreat is employed so that an excessive amount of the photoresist on the roller 12 can be transferred to the squeezee roller 18. Further, the photoresist thus transferred to the squeezee roller 18 is cleared away by a doctor blade 19, whereby an appropriate amount of the photoresist is always kept around the coating roller 12.

As has been described before, it is necessary to give an appropriate tension to the belt-like material 10 to prevent the material 10 from slackening or sagging during a conveyance. Such a tension, according to this coating apparatus, is given to the material 10 by making a difference in a rotating speed between the first pair of driving rollers 21 and 22 and the second pair 23 and 24. In other words, a circumferential speed of the first pair of driving rollers 21 and 22 is made equal to the conveying speed of the belt-like material 10, while the second pair of driving rollers 23 and 24 rotate slightly faster than the conveying speed. Thus, a slight tension can be applied to the material 10 between the two pairs of driving rollers.

However, it may be equally feared that if the second pair of driving rollers 23 and 24 rotate greatly faster than the conveying speed of the material 10 the material may possibly be damaged by the rollers' slippings on the surface of the material. It is therefore preferable to connect the power source with the second pair of driving rollers 23 and 24 through a suitable friction clutch so as to prevent an excessive friction between the rollers (23 and 24) and the belt-like material 10.

It will thus be appreciated that, according to the method of the invention, a uniform and continuous coating of the photoresist onto a metallic foil 3 laminated on a perforated carrier 1 may be achieved by a combination of rollers without having the metallic foil 3 indented at device holes or apertures 2 of the carrier 1.

Although one preferred embodiment of the present invention has been described heretofore with the reference to the accompanying drawings, it should be understood that various modifications and changes can be made without departing from the spirit or the scope of the invention.

What we claim is:

1. In a method for uniformly coating a photoresist by roller coating means utilizing a back-up roller, a coating roller or the like onto a belt-like material consisting of a perforated carrier having longitudinally spaced device holes or apertures and a metallic foil laminated on said perforated carrier, said method comprising:

winding said belt-like material around said back-up roller in such a manner that said perforated carrier directly contacts the outer surface of the back-up roller and a slight tension is produced on the metallic foil, and making said coating roller directly contact the surfaces of the metallic foil of the belt-like material at a portion where the belt-like material is wound around the back-up roller and thereby preventing said belt-like material from being depressed adjacent to said device holes or aperatures during the coating process.

2. A method according to claim 1: further including a step of;

providing at least two detecting means at predetermined positions respectively upstream and downstream of a travelling path of said belt-like material, whereby said coating roller is made to contact said belt-like material when both of said detecting means detect an existence of the belt-like material, and said coating roller on the other hand is made to separate from the contact with the belt-like material when one of said detecting means does not detect the existence of the belt-like material.

3. A method according to claim 2 further including the step of:

providing a squeezee roller which is capable of contacting said coating roller while the coating roller is separated from the belt-like material, thereby transferring onto said squeezee roller said photoresist excessively supplied around the coating roller.

4. A method according to claim 3 wherein excessive photoresist transferred to said squeezee roller from the coating roller is cleared away by a doctor blade.

5. A method according to claim 1 further including a step of;

providing a squeezee roller which is capable of contacting said coating roller while the coating roller is separated from the belt-like material, thereby transferring onto said squeezee roller said photoresist excessively supplied around the coating roller.

6. A method according to claim 5 above, wherein excessive photoresist transferred to said squeezee roller from the coating roller is cleared away by a doctor blade.

* * * * *